US009470975B2

(12) United States Patent
Choi et al.

(10) Patent No.: US 9,470,975 B2
(45) Date of Patent: Oct. 18, 2016

(54) PHOTOSENSITIVE RESIN COMPOSITION AND TOUCH PANEL OR DISPLAY DEVICE INCLUDING BEZEL PATTERN PREPARED BY USING SAME

(71) Applicant: LG CHEM, LTD., Seoul (KR)

(72) Inventors: Dongchang Choi, Daejeon (KR); Kwang Han Park, Daejeon (KR); Kyung Soo Choi, Hanam-si (KR); Geun Young Cha, Daejeon (KR); Sang Chul Lee, Daejeon (KR); Heeyoung Oh, Seoul (KR)

(73) Assignee: LG CHEM, LTD., Seoul (KR)

( * ) Notice: Subject to any disclaimer, the term of this patent is extended or adjusted under 35 U.S.C. 154(b) by 59 days.

(21) Appl. No.: 14/404,258

(22) PCT Filed: Apr. 17, 2013

(86) PCT No.: PCT/KR2013/003242
§ 371 (c)(1),
(2) Date: Nov. 26, 2014

(87) PCT Pub. No.: WO2013/180386
PCT Pub. Date: Dec. 5, 2013

(65) Prior Publication Data
US 2015/0111009 A1 Apr. 23, 2015

(30) Foreign Application Priority Data
May 30, 2012 (KR) .......................... 10-2012-0057457

(51) Int. Cl.
*G03F 7/004* (2006.01)
*G03F 7/033* (2006.01)
*G03F 7/032* (2006.01)
*G06F 3/041* (2006.01)

(52) U.S. Cl.
CPC .............. *G03F 7/033* (2013.01); *G03F 7/032* (2013.01); *G06F 3/041* (2013.01); *G06F 3/0412* (2013.01); *G06F 2203/04103* (2013.01); *Y10T 428/24793* (2015.01)

(58) Field of Classification Search
CPC ...... G03F 7/033; G03F 7/038; G03F 7/0385; G03F 7/0388; G03F 2203/04103; G06F 2203/04103
USPC ......... 430/281.1, 270.1, 322, 325, 329, 905, 430/913; 349/12; 345/173
See application file for complete search history.

(56) References Cited

U.S. PATENT DOCUMENTS

| 2006/0166114 A1 | 7/2006 | Lee | |
|---|---|---|---|
| 2008/0268374 A1 | 10/2008 | Tashiro et al. | |
| 2010/0104981 A1 | 4/2010 | Choi et al. | |
| 2011/0151379 A1 | 6/2011 | Choi et al. | |
| 2011/0267714 A1* | 11/2011 | Makino ............... | C07D 209/86 359/892 |
| 2011/0279387 A1* | 11/2011 | Kim ....................... | G06F 3/044 345/173 |
| 2012/0091407 A1* | 4/2012 | Lee ......................... | G03F 7/032 252/582 |
| 2014/0145973 A1* | 5/2014 | Jeon ....................... | G06F 3/041 345/173 |
| 2015/0065598 A1* | 3/2015 | Paek ..................... | G03F 7/027 522/8 |
| 2015/0125789 A1* | 5/2015 | Park ...................... | G03F 7/038 430/18 |

FOREIGN PATENT DOCUMENTS

| JP | 2005-222028 | | 8/2005 |
|---|---|---|---|
| JP | 2008-304527 | A | 12/2008 |
| JP | 2011-133851 | | 7/2011 |
| JP | 2012-68630 | | 4/2012 |
| KR | 10-1998-0068288 | A | 10/1998 |
| KR | 10-1999-0015097 | A | 3/1999 |
| KR | 10-2007-0031457 | A | 3/2007 |
| KR | 10-2007-0036816 | A | 4/2007 |
| KR | 10-2009-0047620 | A | 5/2009 |
| KR | 10-2012-0047344 | A | 5/2012 |

OTHER PUBLICATIONS

Office Action issued in Korean Patent Application No. 10-2013-0042334 on Jan. 17, 2014 along with English translation, 17 pages.
Office Action issued in Korean Patent Application No. 10-2013-0042334 on Jul. 1, 2014 along with English translation, 8 pages.
International Search Report issued in International Application No. PCT/KR2013/003242 on Jul. 26, 2013, 2 pages.
Office Action (Notification of Reasons for Refusal) for JP 2015-514890 dated Nov. 10, 2015, 14 pages with English translation.

* cited by examiner

*Primary Examiner* — Amanda C Walke
(74) *Attorney, Agent, or Firm* — Rothwell, Figg, Ernst & Manbeck, P.C.

(57) ABSTRACT

The present specification relates to a photoresist resin composition, a touch panel including a bezel pattern manufactured by using the photoresist resin composition, and a display device including the bezel pattern manufactured by using the photoresist resin composition.

17 Claims, No Drawings

PHOTOSENSITIVE RESIN COMPOSITION AND TOUCH PANEL OR DISPLAY DEVICE INCLUDING BEZEL PATTERN PREPARED BY USING SAME

CROSS-REFERENCE TO RELATED APPLICATIONS

This application is a 35 U.S.C. §371 National Phase Entry Application from PCT/KR2013/003242, filed Apr. 17, 2013, and designating the United States, which claims priority to and the benefit of Korean Patent Application No. 10-2012-0057457 filed in the Korean Intellectual Property Office on May 30, 2012, the entire contents of which are incorporated herein by reference.

TECHNICAL FIELD

The present specification relates to a photoresist resin composition, a touch panel including a bezel pattern manufactured by using the photoresist resin composition, and a display device including the bezel pattern manufactured by using the photoresist resin composition.

BACKGROUND ART

Currently, a mobile display market has rapidly expanded, and a touch screen is situated as a main stream of market expansion. The touch screen is a type where an input device such as a keyboard or a mouse is not used but a human's hand or an object comes into direct contact with a screen to perform inputting, and most operations, that is, utilization of an Internet, a moving image, a multi-touch, and the like, can be easily performed on the screen, and thus the touch screen is situated as an optimum user interface in view of convenience.

Representative examples of the touch screen include a resistive type, a capacitive type, an ultrasonic wave type, an optical type, an infrared ray type, and the like according to an implementation type.

At an early stage of the touch screen market, since a technology entry barrier is low and a production cost is low, the resistive type had a 90% or more share. However, there are disadvantages in that durability is poor and light transmittance is low, and decisively, it is almost impossible to implement a multi-touch, and thus, currently, the resistive type is mainly applied to low-priced products.

Currently, the capacitive type is becoming a main implementation type of the touch screen market as an implementation type of overcoming the disadvantages of the resistive type. The capacitive type is a type where a fine current generated in a human's body is detected to drive a touch screen, since a constant current is used, touch sensitivity is excellent, and particularly, since a multi-touch function is feasible, the capacitive type is becoming a strong driving type in a touch screen panel market. Further, since glass is used as a cover, durability is good, light transmittance is 90% or more, and sophisticated sensitivity is provided.

However, the capacitive type is disadvantageous in that an input type is limited and manufacturing cost is high. Many efforts have been made by touch screen panel manufacturers in order to ensure cost competitiveness, and for example, transmittance may be improved and a cost reduction effect may be obtained by using a method of reducing the number of ITO film sensor layers (currently, two layers are applied) occupying a large ratio of the cost, or by developing an integrated touch panel by directly attaching a touch sensor to reinforced glass that is positioned on the uppermost layer in a GLASS type. The aforementioned next-generation integrated touch panel can be manufactured by a method of coating cover glass with a bezel film for shielding and forming a touch sensor layer thereon.

PRIOR ART DOCUMENT

Patent Document

Korean Patent Application Laid-Open No. 10-2002-0090448

SUMMARY OF THE INVENTION

The present specification has been made in an effort to provide a photoresist resin composition, a touch panel including a bezel pattern manufactured by using the photoresist resin composition, and a display device including the bezel pattern manufactured by using the photoresist resin composition.

An exemplary embodiment of the present specification provides a photoresist resin composition including: a binder resin including an acryl-based binder polymerized by a monomer including a compound containing a unsaturated bond, a compound having a long side chain, and a compound including an acid group; a polymerizable compound; an initiator; and a solvent, in which a content of the compound having the long side chain is 1 to 30 mol % based on a total mole number of the monomer.

Another exemplary embodiment of the present specification provides a touch panel including a bezel pattern manufactured by using the photoresist resin composition.

Yet another exemplary embodiment of the present specification provides a display device including a bezel pattern manufactured by using the photoresist resin composition.

A touch panel according to an exemplary embodiment of the present specification has high resistance.

The touch panel according to the exemplary embodiment of the present specification is advantageous in that it is easy to drive a wire positioned on a bezel pattern.

In the exemplary embodiment of the present specification, there is an advantage in that a short circuit does not occur in a metal wire laminated on the bezel pattern.

In the exemplary embodiment of the present specification, there is an advantage in that the bezel pattern has an appropriate shielding characteristic.

DETAILED DESCRIPTION

Hereinafter, the present specification will be described in more detail.

The present specification provides a photoresist resin composition including a binder resin including one or more kinds of acryl-based binders polymerized by a monomer including a compound containing an unsaturated bond, a compound having a long side chain, and a compound including an acid group.

The binder resin includes one or more kinds of acryl-based binders polymerized by the monomer including the compound containing the unsaturated bond, the compound having the long side chain, and the compound including the acid group.

Specifically, the binder resin may include one acryl-based binder, or may include two or more acryl-based binders.

The compound containing the unsaturated bond is not limited as long as the compound is a compound that can provide mechanical strength to the binder resin, but specific examples thereof may include at least one of unsaturated carboxylate esters, aromatic vinyls, unsaturated ethers, unsaturated imides, and maleic anhydrides.

The unsaturated carboxylate esters may be any one or more of benzyl (metha)acrylate, methyl (metha)acrylate, ethyl (metha)acrylate, butyl (metha)acrylate, dimethylaminoethyl(metha)acrylate, isobutyl(metha)acrylate, t-butyl (metha)acrylate, cyclohexyl(metha)acrylate, isobornyl (metha)acrylate, ethylhexyl(metha)acrylate, 2-phenoxyethyl (metha)acrylate, tetrahydrofurfuryl(metha)acrylate, hydroxyethyl(metha)acrylate, 2-hydroxypropyl(metha)acrylate, 2-hydroxy-3-chloropropyl(metha)acrylate, 4-hydroxybutyl(metha)acrylate, glycerol(metha)acrylate, 2-methoxyethyl(metha)acrylate, 3-methoxybutyl(metha)acrylate, phenoxydiethyleneglycol(metha)acrylate, glycidyl(metha)acrylate, dicyclopentanyl(metha)acrylate, dicyclopentenyl (metha)acrylate, dicyclopentenyloxyethyl(metha)acrylate, isobornyl(metha)acrylate, adamentyl(metha)acrylate, hexyl (metha)acrylate, heptyl (metha)acrylate, methyl α-hydroxymethyl acrylate, ethyl α-hydroxymethyl acrylate, propyl α-hydroxymethyl acrylate, and butyl α-hydroxymethyl acrylate, but are not limited thereto.

The aromatic vinyls may be any one or more of styrene, α-methyl styrene, (o,m,p)-vinyl toluene, (o,m,p)-methoxy styrene, and (o,m,p)-chlorostyrene, but are not limited thereto.

The unsaturated ethers may be any one or more of vinyl methyl ether, vinyl ethyl ether, and allyl glycidyl ether, but are not limited thereto.

The unsaturated imides may be any one or more of N-phenyl maleimide, N-(4-chlorophenyl) maleimide, N-(4-hydroxyphenyl) maleimide, and N-cyclohexyl maleimide, but are not limited thereto.

The maleic anhydrides may be any one or more of maleic anhydride and methyl maleic anhydride, but are not limited thereto.

The content of the compound containing the unsaturated bond may be 20 to 80 mol % based on the total mole number of the monomer.

The compound having the long side chain includes an ethylenically unsaturated bond, and is not particularly limited as long as the compound is a compound in which the number of carbon atoms of an alkyl chain substituted in the side chain is 8 to 18. The compound in which the number of carbon atoms of the alkyl chain is 8 to 18 may have a straight chain or a branched chain. The alkyl chain having the number of carbon atoms of 8 to 18 may include a $C_8$~$C_{18}$ alkyl group or a $C_8$~$C_{18}$ alkylene group.

The compound in which the number of carbon atoms of the alkyl chain is 8 to 18 may have a chain which there are continuous alkyl groups or alkylene groups, or a discontinuous chain in which carbon is substituted by oxygen or the like. Even though the alkyl chain is discontinuous, the sum of the numbers of carbon atoms of the alkylene group and the alkyl group in one side chain is 8 to 18.

For example, the compound having the long side chain may include at least one of lauryl methacrylate, octyl(metha)acrylate, nonyl(metha)acrylate, decyl(metha)acrylate, undecyl(metha)acrylate, dodecyl(metha)acrylate, tridecyl(metha)acrylate, tetradecyl(metha)acrylate, pentadecyl(metha)acrylate, hexadecyl(metha)acrylate, heptadecyl(metha)acrylate, octadecyl(metha)acrylate, ethylhexyl(metha)acrylate, p-nonylphenoxypolyethyleneglycol(metha)acrylate, p-nonylphenoxypolypropyleneglycol(metha)acrylate, ethoxydiethyleneglycol(metha)acrylate, methoxytriethyleneglycol(metha)acrylate, methoxytripropyleneglycol(metha)acrylate, poly(ethyleneglycol)methylether(metha)acrylate, stearyl(metha)acrylate, ethoxyhexyl (metha)acrylate, ethoxyheptyl(metha)acrylate, ethoxyoctyl (metha)acrylate, and methoxynonyl(metha)acrylate.

The content of the compound having the long side chain may be 1 to 30 mol % based on the total mole number of the monomer, and in this case, there is an advantage in that the taper angle of the bezel pattern as described below can be controlled.

If necessary, the content of the compound having the long side chain may be 5 to 30 mol % based on the total mole number of the monomer. In the case where the content of the compound having the long side chain is less than 5 mol %, since a developing margin and sensitivity become good but the taper angle is increased, when an indium tin oxide (ITO) is formed, which is performed during a post-process, a possibility of causing a short-circuit is increased, and thus defects may be generated. Further, in the case where the content is more than 30 mol %, the taper angle may be reduced, but the developing margin in a developing process of forming a black matrix pattern is small, and thus there is a problem in mass production, and chemical resistance may be weakened in an etching process or a strip process performed when the indium tin oxide (ITO) wire is formed to cause a loss of the pattern.

The compound including the acid group may be any one or more of (metha)acrylic acid, crotonic acid, itaconic acid, maleic acid, fumaric acid, monomethyl maleic acid, 5-nobonen-2-carboxylic acid, mono-2-((metha)acryloyloxy) ethyl phthalate, mono-2-((metha)acryloyloxy)ethyl succinate, and ω-carboxypolycaprolactone mono(metha)acrylate, but is not limited thereto.

The content of the compound including the acid group may be 5 to 50 mol %, and if necessary, 5 to 40 mol % based on the total mole number of the monomer.

A weight average molecular weight of the acryl-based binder may be 1,000 to 50,000, and if necessary, 2,000 to 30,000, but is not limited thereto.

An acid value of the acryl-based binder may be 10 KOH mg/g to 200 KOH mg/g, and if necessary, 30 KOH mg/g to 150 KOH mg/g.

In the photoresist resin composition of the exemplary embodiment of the present specification, in the case where the acryl-based binder is included, a thickness of the bezel pattern as described below may be adjusted. Specifically, there is an advantage in that the thickness of the bezel pattern can be adjusted to be small.

The content of the acryl-based binder may be 50 to 90 wt % based on the total weight of the binder resin.

The binder resin may further include a binder resin generally used in the art.

In the photoresist resin composition of the exemplary embodiment of the present specification, the binder resin may further include an additional acryl-based binder polymerized by a compound containing an unsaturated bond and a compound including an acid group. The additional acryl-based binder means a binder where a side chain is not long, that is, an acryl-based binder that is not derived from the compound having the long side chain.

In the case where the binder resin of the exemplary embodiment of the present specification further includes an additional acryl-based binder, the content of the acryl-based binder may be 50 to 90 wt % and the content of the additional acryl-based binder may be 10 to 50 wt % based on the total weight of the binder resin.

In the photoresist resin composition of the exemplary embodiment of the present specification, the binder resin may further include a fluorene-based binder having a repeating unit represented by the following Chemical Formula 1.

[Chemical Formula 1]

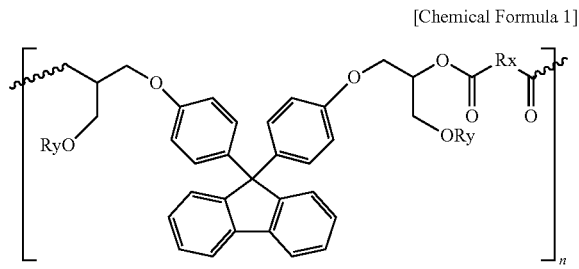

In Chemical Formula 1,

Rx is a $C_1$ to $C_{10}$ alkylene group; a $C_3$ to $C_{10}$ cycloalkylene group unsubstituted or substituted by a $C_1$ to $C_5$ alkyl group; a $C_6$ to $C_{10}$ arylene group unsubstituted or substituted by a $C_1$ to $C_5$ alkyl group; or —NH—R—NH— unsubstituted or substituted by a $C_1$ to $C_5$ alkyl group, R is a $C_1$ to $C_{10}$ alkylene group; a $C_3$ to $C_{20}$ cycloalkylene group unsubstituted or substituted by a $C_1$ to $C_5$ alkyl group; or a $C_6$ to $C_{10}$ arylene group unsubstituted or substituted by a $C_1$ to $C_5$ alkyl group, Ry is hydrogen, acryloyl, or methacryloyl, and n is an integer of 1 to 5,000.

In the case where the binder resin of the exemplary embodiment of the present specification includes the fluorene-based binder, the content of the acryl-based binder may be 50 to 90 wt % and the content of the fluorene-based binder may be 10 to 50 wt % based on the total weight of the binder resin.

In the case where the binder resin of the exemplary embodiment of the present specification further includes the fluorene-based binder and the additional acryl-based binder, the content of the acryl-based binder may be 50 to 90 wt %, the content of the additional acryl-based binder may be 1 to 50 wt %, and the content of the fluorene-based binder may be 1 to 50 wt % based on the total weight of the binder resin.

A weight average molecular weight of the fluorene-based binder may be 1,000 to 30,000, and if necessary, 1,500 to 10,000, but is not limited thereto.

In the present specification, the weight average molecular weight means a result value measured by a gel permeation chromatography, that is, a GPC.

An acid value of the fluorene-based binder may be 10 KOH mg/g to 200 KOH mg/g, and if necessary, 30 KOH mg/g to 150 KOH mg/g.

The content of the binder resin may be 1 to 20 wt % based on the total weight of the photoresist resin composition.

The photoresist resin composition of the present specification may further include a polymerizable compound; a colorant; an initiator; and a solvent.

The polymerizable compound is a multifunctional monomer having an ethylenically unsaturated double bond and is not limited as long as the polymerizable compound can act as a crosslinking agent, and a compound generally used in the art may be used.

For example, the polymerizable compound may be any one or more of a compound having an unsaturated group that can be subjected to addition polymerization and a multifunctional monomer into which caprolactone is introduced.

As the compound having the unsaturated group that can be subjected to addition polymerization, specifically, one or more kinds selected from the group consisting of a monofunctional monomer such as polyethyleneglycol mono(metha)acrylate, polypropyleneglycol mono(metha)acrylate, and phenoxyethyl(metha)acrylate; and a multifunctional monomer such as polyethyleneglycol(metha)acrylate, polypropyleneglycol(metha)acrylate, trimethylolethane triacrylate, trimethylolpropane triacrylate, neopentylglycol(metha)acrylate, pentaerythritol tetraacrylate, pentaerythritol triacrylate, dipentaerythritol pentaacrylate, and dipentaerythritol hexaacrylate may be used, but the compound is not limited thereto.

As the multifunctional monomer into which caprolactone is introduced, one or more kinds selected from the group consisting of KAYARAD DPCA-20, 30, 60, and 120 in which caprolactone is introduced into dipentaerythritol, KAYARAD TC-110S in which caprolactone is introduced into tetrahydrofuryl acrylate, KAYARAD HX-220 and KAYARAD HK-620 in which caprolactone is introduced into neopentylglycol hydroxypyvalate, and the like; epoxy ester 200PA, epoxy ester 3002M, epoxy ester 3002A, and epoxy ester 3000M as products of Kongyoungsa Corp.; and UA306H, UA306T, UA306I, UA510H, UF8001, U-324A, U15HA, and U-4HA as urethane acrylate series may be used, but the multifunctional monomer is not limited thereto.

In the present specification, introduction of a predetermined compound means ensuring of a state where the predetermined compound is bonded with another compound by a chemical reaction, which may be understood by the person with ordinary skill in the art.

The content of the polymerizable compound may be 1 to 10 wt % based on the total weight of the photoresist resin composition, and in this case, there are advantages in that photosensitivity or strength of a coating film is not reduced, the strength of the coating film is sufficient, and the pattern is not lost while developing.

One or more kinds of pigments, dyes, or mixtures thereof may be used as the colorant, and the colorant is not particularly limited as long as the colorant can express a color according to the requirements.

Specifically, carbon black, graphite, metal oxides, and the like may be used as a black pigment.

Examples of the carbon black include Cisto 5HIISAF-HS, Cisto KH, Cisto 3HHAF-HS, Cisto NH, Cisto 3M, Cisto 300HAF-LS, Cisto 116HMMAF-HS, Cisto 116MAF, Cisto FMFEF-HS, Cisto SOFEF, Cisto VGPF, Cisto SVHSRF-HS, and Cisto SSRF (Donghae Carbon, Co., Ltd.); Diagram black II, Diagram black N339, Diagram black SH, Diagram black H, Diagram LH, Diagram HA, Diagram SF, Diagram N550M, Diagram M, Diagram E, Diagram G, Diagram R, Diagram N760M, Diagram LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B, and OIL31B (Mitsubishi Chemical Corporation); PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100, and LAMP BLACK-101 (Degussa GmbH); RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA, and RAVEN-1170 (Columbian Carbon Company), mixtures thereof or the like.

In the case where carbon black is used as the black pigment, carbon black that is subjected to high resistance treatment may be used, and in this case, the high resistance treatment may be performed through treatment using a polymer resin, an azo-coupling reaction, or the like, but is not limited thereto.

The black pigment may include an organic black pigment. Aniline black, lactam black, perylene black series, or the like may be used as the organic black pigment, but the organic black pigment is not limited thereto.

Examples of the colorant exhibiting a color include carmine 6B (C.I.12490), phthalocyanine green (C.I. 74260), phthalocyanine blue (C.I. 74160), perylene black (BASF K0084. K0086), cyanine black, linol yellow (C.I.21090), linol yellow GRO (C.I. 21090), benzidine yellow 4T-564D, victoria pure blue (C.I.42595), C.I. PIGMENT RED 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264, and 272; C.I. PIGMENT GREEN 7, 36; C.I. PIGMENT blue 15:1, 15:3, 15:4, 15:6, 16, 22, 28, 36, 60, and 64; C.I. PIGMENT yellow 13, 14, 35, 53, 83, 93, 95, 110, 120, 138, 139, 150, 151, 154, 175, 180, 181, 185, 194, and 213; C.I. PIGMENT VIOLET 15, 19, 23, 29, 32, and 37, and the like, and in addition to this, a white pigment, a fluorescent pigment or the like may be used. A material in which zinc is used as the central metal other than copper may be used as the phthalocyanine-based complex compound used as the pigment.

According to the exemplary embodiment of the present specification, the colorant may be a high resistance colorant, in this case, a surface resistance value of the colorant may be $10^{12}$ Ω/square or more, and the higher the surface resistance value, the better, but if necessary, the surface resistance value may be $10^{12}$ to $10^{20}$ Ω/square. In the case where a surface resistance value is less than $10^{12}$ Ω/square, an insulating characteristic may be reduced, which affects an electric field of metal wires progressing during a post-process to cause defects.

The content of the colorant may be 5 to 30 wt % based on the total weight of the photoresist resin composition.

The initiator is a material generating radicals by light to promote crosslinking, and it is preferable to use one or more kinds selected from the group consisting of an acetophenone-based compound, a biimidazole-based compound, a triazine-based compound, and an oxime-based compound.

Examples of the acetophenone-based compound include 2-hydroxy-2-methyl-1-phenylpropane-1-one, 1-(4-isopropylphenyl)-2-hydroxy-2-methylpropane-1-one, 4-(2-hydroxyethoxy)-phenyl-(2-hydroxy-2-propyl)ketone, 1-hydroxycyclohexylphenylketone, benzoinmethyl ether, benzoinethyl ether, benzoinisobutyl ether, benzoinbutyl ether, 2,2-dimethoxy-2-phenylacetophenone, 2-methyl-(4-methylthio)phenyl-2-morpholino-1-propane-1-one, 2-benzyl-2-dimethylamino-1-(4-morpholinophenyl)-butane-1-one, 2-(4-bromo-benzyl-2-dimethylamino-1-(4-morpholinophenyl)-butane-1-one, 2-methyl-1-[4-(methylthio)phenyl]-2-morpholinopropane-1-one, and the like, but are not limited thereto.

Examples of the biimidazole-based compound include 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4', 5,5'-tetraphenyl biimidazole, 2,2'-bis(o-chlorophenyl)-4,4,5, 5'-tetraphenyl-1,2'-biimidazole, and the like, but are not limited thereto.

Examples of the triazine-based compound include 3-{4-[2,4-bis(trichloromethyl)-s-triazine-6-yl]phenylthio}propionic acid, 1,1,1,3,3,3-hexafluoroisopropyl-3-{4-[2,4-bis(trichloromethyl)-s-triazine-6-yl]phenylthio}propionate, ethyl-2-{4-[2,4-bis(trichloromethyl)-s-triazine-6-yl]phenylthio}acetate, 2-epoxyethyl-2-{4-[2,4-bis(trichloromethyl)-s-triazine-6-yl]phenylthio}acetate, cyclohexyl-2-{4-[2,4-bis(trichloromethyl)-s-triazine-6-yl]phenylthio}acetate, benzyl-2-{4-[2,4-bis(trichloromethyl)-s-triazine-6-yl]phenylthio}acetate, 3-{chloro-4-[2,4-bis(trichloromethyl)-s-triazine-6-yl]phenylthio}propionic acid, 3-{4-[2,4-bis(trichloromethyl)-s-triazine-6-yl]phenylthio}propionamide, 2,4-bis(trichloromethyl)-6-p-methoxystyryl-s-triazine, 2,4-bis(trichloromethyl)-6-(1-p-dimethylaminophenyl)-1,3,-butadienyl-s-triazine, 2-trichloromethyl-4-amino-6-p-methoxystyryl-s-triazine, and the like, but are not limited thereto.

Examples of the oxime-based compound include 1,2-octadione-1-(4-phenylthio)phenyl-2-(o-benzoyloxime) (CIBA-GEIGY Corp., CGI 124), ethanone-1-(9-ethyl)-6-(2-methylbenzoyl-3-yl)-1-(o-acetyloxime) (CGI 242), N-1919 (Adeka Corporation), and the like, but are not limited thereto.

The content of the initiator may be 1 to 300 parts by weight based on 100 parts by weight that is the sum of the polymerizable compound and the binder resin in the photoresist resin composition.

In the case where the acetophenone-based compound is used as the initiator, the content of the acetophenone-based compound may be 1 to 200 parts by weight based on 100 parts by weight that is the sum of the polymerizable compound and the binder resin in the photoresist resin composition.

In the case where the biimidazole-based compound is used as the initiator, the content of the biimidazole-based compound may be 1 to 100 parts by weight based on 100 parts by weight that is the sum of the polymerizable compound and the binder resin in the photoresist resin composition.

In the case where the triazine-based compound is used as the initiator, the content of the triazine-based compound may be 1 to 100 parts by weight based on 100 parts by weight that is the sum of the polymerizable compound and the binder resin in the photoresist resin composition.

In the case where the oxime-based compound is used as the initiator, the content of the oxime-based compound may be 1 to 50 parts by weight based on 100 parts by weight that is the sum of the polymerizable compound and the binder resin in the photoresist resin composition.

The content of the initiator may be 0.1 to 10 wt % based on the total weight of the photoresist resin composition.

It is preferable that the solvent be one or more kinds selected from methyl-3-methoxy propionate (144° C.), ethyleneglycol methylether (125° C.), ethyleneglycol ethylether (135° C.), ethyleneglycol diethylether (121° C.), dibutylether (140° C.), ethyl pyruvate (144° C.), propyleneglycol methylether (121° C.), propyleneglycol methylether acetate (146° C.), n-butyl acetate (125° C.), isobutyl acetate (116° C.), amyl acetate (149° C.), isoamyl acetate (143° C.), butyl propionate (146° C.), isoamyl propionate (156° C.), ethyl butyrate (120° C.), propyl butyrate (143° C.), methyl-3-methoxy isobutyrate (148° C.), methyl glycolate (150° C.), methyl lactate (145° C.), ethyl lactate (154° C.), methyl-2- hydroxy isobutyrate (137° C.), ethylethoxy acetate (156° C.), 2-methoxyethyl acetate (145° C.), ethyleneglycolmethylether acetate (145° C.), 2-ethoxyethyl acetate (156° C.), dibutylether (140° C.), cyclopentanone (131° C.), cyclohexanone (155° C.), 2-hexanone (127° C.), 3-hexanone (123° C.), 5-methyl-2-hexanone (145° C.), 2-heptanone (150° C.), 3-heptanone (148° C.), 4-heptanone (145° C.), 2-methyl-3-heptanone (159° C.), 1-methoxy-2-propanol (118° C.), ethyl-2-hydroxy-propionate (154° C.), ethyl-3-methoxy propionate (158° C.), 2-methoxyethylether (162° C.), 3-methoxybutyl acetate (170° C.), 2-ethoxyethylether (185° C.), 2-butoxyethanol (171° C.), 3-ethoxy-propanol (161° C.), diethyleneglycoldodecylether (169° C.), dipropyleneglycol methylether (188° C.), 2,6-dimethyl-4-heptanone (169° C.), 2-octanone (173° C.), 3-octanone (168° C.), 3-nonanone (188° C.), 5-nonanone (187° C.), 4-hydroxy-4-methyl-2-pentanone (166° C.), 2-methylcyclohexanone (163° C.), 3-methylcyclohexanone (170° C.), 4-methylcyclohexanone (170° C.), 2,6-dimethylcyclohexanone (175° C.), 2,2,6-trimethylcyclohexanone (179° C.), cycloheptanone (179° C.), hexyl acetate (169° C.), amyl butyrate (185° C.), isopropyl lactate (167° C.), butyl lactate (186° C.), ethyl-3-hydroxy butyrate (170° C.), ethyl-3-ethoxy propionate (170° C.), ethyl-3-hydroxy butyrate (180° C.), propyl-2-hydroxy-propionate (169° C.), propyleneglycol diacetate (186° C.), propyleneglycol butylether (170° C.), propyleneglycol methylether propionate (160° C.), diethyleneglycol dimethylether (162° C.), diethyleneglycol dimethylether acetate (165° C.), dipropyleneglycol methylether (188° C.), dipropyleneglycol dimethylether (171° C.), ethyleneglycol butylether (171° C.), diethyleneglycol methylethylether (176° C.), diethyleneglycol methylisopropylether (179° C.), diethyleneglycol diethylether (189° C.), butyl butyrate (165° C.), ethyl-3-ethoxy propionate (170° C.), diethyleneglycol monomethylether (194° C.), 4-ethylcyclohexanone (193° C.), 2-butoxyethyl acetate (192° C.), diethyleneglycol monoethylether (202° C.), butyrolactone (204° C.), hexyl butyrate (205° C.), diethyleneglycol methylether acetate (209° C.), diethyleneglycol butylmethylether (212° C.), tripropylglycol dimethylether (215° C.), triethyleneglycol dimethylether (216° C.), diethyleneglycol ethylether acetate (217° C.), diethyleneglycol butylether acetate (245° C.), 3-epoxy-1,2-propanediol (222° C.), ethyl-4-acetyl butyrate (222° C.), diethyleneglycol monobutylether (231° C.), tripropylglycol methylether (242° C.), diethyleneglycol (245° C.), 2-(2-butoxyethoxyl)ethyl acetate (245° C.), catechol (245° C.), triethyleneglycol methylether (249° C.), diethyleneglycol dibutylether (256° C.), triethyleneglycol ethylether (256° C.), diethyleneglycol monohectylether (260° C.), triethyleneglycol butylmethylether (261° C.), triethyleneglycol butylether (271° C.), tripropylglycol (273° C.), and tetraethyleneglycol dimethylether (276° C.).

The content of the solvent may be 60 to 90 wt % based on the total weight of the photoresist resin composition.

The photoresist resin composition of the present specification may further include any one or more additives of an adhesion promoter, a photocrosslinking sensitizer, a curing accelerator, a surfactant, a dispersing agent, an antioxidant, an ultraviolet ray absorbent, a thermal polymerization inhibitor, and a leveling agent.

As the adhesion promoter, one or more kinds selected from methacryloylsilane coupling agents such as methacryloyloxy propyltrimethoxysilane, methacryloyloxy propyldimethoxysilane, methacryloyloxy propyltriethoxysilane, and methacryloyloxy propyldimethoxysilane may be used, and one or more kinds selected from alkyl trimethoxysilane such as octyltrimethoxysilane, dodecyltrimethoxysilane, octadecyltrimethoxysilane, and the like may be used.

As the photocrosslinking sensitizer, one or more kinds selected from the group consisting of a benzophenone-based compound such as benzophenone, 4,4-bis(dimethylamino) benzophenone, 4,4-bis(diethylamino)benzophenone, 2,4,6-trimethylaminobenzophenone, methyl-o-benzoylbenzoate, 3,3-dimethyl-4-methoxybenzophenone, and 3,3,4,4-tetra(t-butylperoxycarbonyl)benzophenone; a fluorenone-based compound such as 9-fluorenone, 2-chloro-9-fluorenone, and 2-methyl-9-fluorenone; a thioxanthone-based compound such as thioxanthone, 2,4-diethylthioxanthone, 2-chlorothioxanthone, 1-chloro-4-propyloxythioxanthone, isopropylthioxanthone, and diisopropylthioxanthone; a xanthone-based compound such as xanthone and 2-methylxanthone; an anthraquinone-based compound such as anthraquinone, 2-methyl anthraquinone, 2-ethyl anthraquinone, t-butyl anthraquinone, and 2,6-dichloro-9,10-anthraquinone; an acridine-based compound such as 9-phenylacridine, 1,7-bis(9-acridinyl)heptane, 1,5-bis(9-acridinylpentane), and 1,3-bis(9-acridinyl)propane; a dicarbonyl compound such as benzyl, 1,7,7-trimethyl-bicyclo[2,2,1]heptane-2,3-dione, and 9,10-penanthrenequinone; a phosphine oxide-based compound such as 2,4,6-trimethylbenzoyl diphenylphosphine oxide, and bis(2,6-dimethoxybenzoyl)-2,4,4-trimethylpentyl phosphine oxide; a benzoate-based compound such as methyl-4-(dimethylamino)benzoate, ethyl-4-(dimethylamino)benzoate, and 2-n-butoxyethyl-4-(dimethylamino) benzoate; an amino synergist such as 2,5-bis(4-diethylaminobenzal)cyclopentanone, 2,6-bis(4-diethylaminobenzal) cyclohexanone, and 2,6-bis(4-diethylaminobenzal)-4-methyl-cyclopentanone; a coumarin-based compound such as 3,3-carbonylvinyl-7-(diethylamino)coumarin, 3-(2-benzothiazolyl)-7-(diethylamino)coumarin, 3-benzoyl-7-(diethylamino)coumarin, 3-benzoyl-7-methoxy-coumarin, and 10,10-carbonylbis[1,1,7,7-tetramethyl-2,3,6,7-tetrahydro-1H,5H,11H—C$_1$]-benzopyrano[6,7,8-ij]-quinolizine-11-one; a chalcone compound such as 4-diethylamino chalcone, and 4-azidebenzalacetophenone; 2-benzoylmethylene; and 3-methyl-b-naphthothiazoline may be used.

As the curing accelerator, one or more kinds selected from the group consisting of 2-mercaptobenzoimidazole, 2-mercaptobenzothiazol, 2-mercaptobenzooxazole, 2,5-dimercapto-1,3,4-thiadiazole, 2-mercapto-4,6-dimethylaminopyridine, pentaerythritol-tetrakis(3-mercapto propionate), pentaerythritol-tris(3-mercapto propionate), pentaerythritol-tetrakis(2-mercapto acetate), pentaerythritol-tris(2-mercapto acetate), trimethylolpropane-tris(2-mercapto acetate), and trimethylolpropane-tris(3-mercapto propionate) may be used.

The surfactant is a silicon-based surfactant or a fluorine-based surfactant, and specifically, as the silicon-based surfactant, BYK-077, BYK-085, BYK-300, BYK-301, BYK-302, BYK-306, BYK-307, BYK-310, BYK-320, BYK-322, BYK-323, BYK-325, BYK-330, BYK-331, BYK-333, BYK-335, BYK-341v344, BYK-345v346, BYK-348, BYK-354, BYK-355, BYK-356, BYK-358, BYK-361, BYK-370, BYK-371, BYK-375, BYK-380, BYK-390, and the like manufactured by BYK-Chemie GmbH may be used, and as the fluorine-based surfactant, F-114, F-177, F-410, F-411, F-450, F-493, F-494, F-443, F-444, F-445, F-446, F-470, F-471, F-472SF, F-474, F-475, F-477, F-478, F-479, F-480SF, F-482, F-483, F-484, F-486, F-487, F-172D, MCF-350SF, TF-1025SF, TF-1117SF, TF-1026SF, TF-1128, TF-1127, TF-1129, TF-1126, TF-1130, TF-1116SF, TF-1131, TF1132, TF1027SF, TF-1441, TF-1442, and the like manufactured by DIC (DaiNippon Ink & Chemicals) Incorporated may be used, but the surfactant is not limited thereto.

The dispersing agent may be used by a method of internally adding the dispersing agent to a pigment in a form where the pigment is previously subjected to surface treatment, or a method of externally adding the dispersing agent to the pigment. As the dispersing agent, a compound type, non-ionic, anionic, or cationic dispersing agent may be used, and examples thereof include one or more kinds selected from the group consisting of polyalkyleneglycol and ester thereof, polyoxyalkylene polyvalent alcohol, an esteralkylene oxide adduct, an alcohol alkylene oxide adduct, ester sulfonate, a sulfonate salt, carboxylate ester, a carboxylate salt, an alkylamidealkylene oxide adduct, and alkylamine, but are not limited thereto.

Examples of the thermal polymerization inhibitor may include one or more kinds selected from the group consisting of p-anisole, hydroquinone, pyrocatechol, t-butyl catechol, a N-nitrosophenylhydroxyamine ammonium salt, a N-nitrosophenylhydroxyamine aluminum salt, and phenothiazine, but are not limited thereto and may include matters that are generally known in the art.

As the antioxidant, the ultraviolet ray absorbent, the leveling agent, and the like, all compounds that may be included in the art may be used.

The contents of the additives may be each independently 0.01 to 10 wt % based on the total weight of the photoresist resin composition, but are not limited thereto.

In addition, the photoresist resin composition of the present specification may further include one or more kinds of secondary additives selected from a carbon black dispersion material, a resin binder having functionality, a monomer, a radiation sensitive compound, and other additives.

The present specification provides a touch panel including a substrate; and a bezel pattern manufactured by using the photoresist resin composition on the substrate.

A method of forming the bezel pattern on the substrate may be a photolithography method. Specifically, bezel pattern may be manufactured by applying the photoresist resin composition on the substrate and then exposing and developing the applied composition.

A method of applying the photoresist resin composition on the substrate is not particularly limited, but a spray method, a roll coating method, a spin coating method, and the like may be used, and the spin coating method is generally widely used. Further, after a coat layer is formed, in some cases, a portion of a remaining solvent may be removed under reduced pressure.

Examples of a light source for curing the photoresist resin composition according to the present specification include a mercury vapor arc, a carbon arc, a Xe arc, and the like emitting light having a wavelength of 250 to 450 nm, but are not necessarily limited thereto.

The taper angle of the bezel pattern may be more than 0° and 60° or less, specifically more than 0° and 40° or less, and if necessary, more than 0° and 30° or less. In this case, when a sensor layer is applied onto the bezel pattern, there is an advantage in that a short-circuit of a wire does not occur due to a smooth taper angle.

The thickness of the bezel pattern may be 0.3 µm to 5 µm, and if necessary, 0.8 µm to 3 µm. In this case, even though the sensor layer is applied onto the bezel pattern, there is an advantage in that a short-circuit of the wire does not occur due to a difference in height with the substrate.

The surface resistance value of the bezel pattern is $10^{12}$ Ω/square or more, the higher the surface resistance value, the better, but if necessary, the surface resistance value may be $10^{12}$ to $10^{20}$ Ω/square. In this case, there is an advantage in that it is easy to form the metal wire through deposition or adhesion of the metal layer on the bezel pattern.

The optical density per the thickness (1 µm) of the bezel pattern is 1 to 5, and if necessary, may be 2 to 4. In this case, there is an advantage in that a shielding characteristic by the bezel pattern is excellent. In the case where the optical density is more than 5 per unit thickness, there is a risk of reducing resistance, and the content of a light shielding material used to implement the optical density is increased, and thus formation of the pattern may become difficult.

The touch panel according to the exemplary embodiment of the present specification is advantageous in that the thickness of the bezel pattern is small and the shielding characteristic is excellent.

The touch panel according to the exemplary embodiment of the present specification has high resistance.

The touch panel according to the exemplary embodiment of the present specification is advantageous in that it is easy to drive a wire positioned on the bezel pattern.

The present specification provides a display device including a substrate; and a bezel pattern manufactured by using the photoresist resin composition on the substrate.

The display device may be any one of a plasma display panel (PDP), a light emitting diode (LED), an organic light emitting diode (OLED), a liquid crystal display (LCD), a thin film transistor-liquid crystal display (LCD-TFT), and a cathode ray tube (CRT).

The taper angle of the bezel pattern may be more than 0° and 60° or less, specifically more than 0° and 40° or less, and if necessary, more than 0° and 30° or less. In this case, when a sensor layer is applied onto the bezel pattern, there is an advantage in that a short-circuit of a wire does not occur due to a smooth taper angle.

The thickness of the bezel pattern may be 0.3 µm to 5 µm, and if necessary, 0.8 µm to 3 µm. In this case, even though the sensor layer is applied onto the bezel pattern, there is an advantage in that the short-circuit of the wire does not occur due to a difference in height with the substrate.

The surface resistance value of the bezel pattern is $10^{12}$ Ω/square or more, the higher the surface resistance value, the better, but if necessary, the surface resistance value may be $10^{12}$ to $10^{20}$ Ω/square. In this case, there is an advantage in that it is easy to form the metal wire through deposition or adhesion of the metal layer on the bezel pattern.

The optical density per the thickness (1 µm) of the bezel pattern is 1 to 5, and if necessary, may be 2 to 4. In this case, there is an advantage in that a shielding characteristic by the bezel pattern is excellent. In the case where the optical density is more than 5 per unit thickness, there is a risk of reducing resistance, and the content of a light shielding material used to implement the optical density is increased, and thus formation of the pattern may become difficult.

In the present specification, the bezel pattern means a pattern formed at an edge portion of various kinds of devices such as a clock and a display device.

Hereinafter, the present specification will be described in detail with reference to Examples. The following Examples are set forth to illustrate the present specification, and the scope of the present specification includes the scope described in the following claims, and substitutions and modifications thereof, but is not limited to the scope of the Examples.

EXAMPLE

Example 1

600 g of the carbon dispersion solution (TOKUSHIKI, Co., Ltd., BK_8115, carbon content 20%), 70 g of benzyl methacrylate/N-phenylmaleimide/styrene/methacrylic acid to which glycidyl methacrylate was added/methacrylic acid {(molar ratio 38/7/7/17/31, Mw=9000, 124 KOH mg/g), solid content 30%} as the alkali-soluble acryl-based binder 1, 130 g of benzyl methacrylate/N-phenylmaleimide/styrene/lauryl methacrylate/methacrylic acid {(molar ratio 44/7/8/14/27, Mw=19000, 105 KOH mg/g), solid content 30%} as the acryl-based binder 2, 35 g of dipentaerythritol hexaacrylate as the multifunctional monomer, 20 g of N-1919 (Adeka Corporation) as the photopolymerization initiator, 5 g of 3-methacryloxypropyltrimethoxysilane as the adhesion promoter, 1 g of F-475 (DIC Corporation) as the leveling agent, 530 g of propyleneglycolmonomethylether acetate as the solvent, and 100 g of 3-methoxybutyl acetate were mixed.

Thereafter, the photoresist resin composition was manufactured by agitating the mixture for 5 hours.

Example 2

600 g of the carbon dispersion solution (TOKUSHIKI, Co., Ltd., BK_8115, carbon content 20%), 70 g of benzyl methacrylate/N-phenylmaleimide/styrene/methacrylic acid to which glycidyl methacrylate was added/methacrylic acid {(molar ratio 38/7/7/17/31, Mw=9000, 124 KOH mg/g), solid content 30%} as the alkali-soluble acryl-based binder 1, 100 g of benzyl methacrylate/N-phenylmaleimide/styrene/lauryl methacrylate/methacrylic acid {(molar ratio 44/7/8/14/27, Mw=19000, 105 KOH mg/g), solid content 30%} as the acryl-based binder 2, 30 g of the fluorene-based binder {bisphenol fluorene epoxy acrylate to which the acrylic acid was added/1,3-cyclohexyl diisocyanate (molar ratio 65/35, Mw=5000, acid value 80 KOH mg/g), solid content 35%}, 35 g of dipentaerythritol hexaacrylate as the multifunctional monomer, 20 g of N-1919 (Adeka Corporation) as the photopolymerization initiator, 5 g of 3-methacryloxypropyltrimethoxysilane as the adhesion promoter, 1 g of F-475 (DIC Corporation) as the leveling agent, 530 g of propyleneglycolmonomethylether acetate as the solvent, and 100 g of 3-methoxybutyl acetate were mixed.

Thereafter, the photoresist resin composition was manufactured by agitating the mixture for 5 hours.

Example 3

600 g of the carbon dispersion solution (TOKUSHIKI, Co., Ltd., BK_8115, carbon content 20%), 150 g of benzyl methacrylate/N-phenylmaleimide/styrene/lauryl methacrylate/methacrylic acid to which glycidyl methacrylate was added/methacrylic acid {(molar ratio 35/7/7/14/12/25, Mw=18000, 105 KOH mg/g), solid content 30%} as the alkali-soluble acryl-based binder, 40 g of the fluorene-based binder {bisphenol fluorene epoxy acrylate to which the acrylic acid was added/1,3-cyclohexyl diisocyanate (molar ratio 65/35, Mw=5000, acid value 80 KOH mg/g), solid content 35%}, 35 g of dipentaerythritol hexaacrylate as the multifunctional monomer, 20 g of N-1919 (Adeka Corporation) as the photopolymerization initiator, 5 g of 3-methacryloxypropyltrimethoxysilane as the adhesion promoter, 1 g of F-475 (DIC Corporation) as the leveling agent, 530 g of propyleneglycolmonomethylether acetate as the solvent, and 100 g of 3-methoxybutyl acetate were mixed.

Thereafter, the photoresist resin composition was manufactured by agitating the mixture for 5 hours.

Comparative Example 1

600 g of the carbon dispersion solution (TOKUSHIKI, Co., Ltd., BK_8115, carbon content 20%), 200 g of benzyl methacrylate/N-phenylmaleimide/styrene/methacrylic acid to which glycidyl methacrylate was added/methacrylic acid {(molar ratio 38/7/7/17/31, Mw=15000, 124 KOH mg/g), solid content 30%} as the alkali-soluble acryl-based binder, 35 g of dipentaerythritol hexaacrylate as the multifunctional monomer, 20 g of N-1919 (Adeka Corporation) as the photopolymerization initiator, 5 parts by weight of 3-methacryloxypropyltrimethoxysilane as the adhesion promoter, 1 g of F-475 (DIC Corporation) as the leveling agent, 530 g of propyleneglycolmonomethylether acetate as the solvent, and 100 g of 3-methoxybutyl acetate were mixed.

Thereafter, the photoresist resin composition was manufactured by agitating the mixture for 5 hours.

Comparative Example 2

600 g of the carbon dispersion solution (TOKUSHIKI, Co., Ltd., BK_8115, carbon content 20%), 200 g of benzyl methacrylate/lauryl methacrylate/methacrylic acid to which glycidyl methacrylate was added/methacrylic acid {(molar ratio 30/35/8/27, Mw=13000, 105 KOH mg/g), solid content 30%} as the alkali-soluble acryl-based binder, 35 g of dipentaerythritol hexaacrylate as the multifunctional monomer, 20 g of N-1919 (Adeka Corporation) as the photopolymerization initiator, 5 parts by weight of 3-methacryloxypropyltrimethoxysilane as the adhesion promoter, 1 g of F-475 (DIC Corporation) as the leveling agent, 530 g of propyleneglycolmonomethylether acetate as the solvent, and 100 g of 3-methoxybutyl acetate were mixed.

Thereafter, the photoresist resin composition was manufactured by agitating the mixture for 5 hours.

Comparative Example 3

600 g of the carbon dispersion solution (TOKUSHIKI, Co., Ltd., BK_8115, carbon content 20%), 50 g of benzyl methacrylate/N-phenylmaleimide/styrene/methacrylic acid to which glycidyl methacrylate was added/methacrylic acid {(molar ratio 38/7/7/17/31, Mw=9000, 124 KOH mg/g), solid content 30%} as the alkali-soluble acryl-based binder 1, 50 g of benzyl methacrylate/N-phenylmaleimide/styrene/lauryl methacrylate/methacrylic acid {(molar ratio 44/7/8/14/27, Mw=19000, 105 KOH mg/g), solid content 30%} as the acryl-based binder 2, 100 g of the fluorene-based binder {bisphenol fluorene epoxy acrylate to which the acrylic acid was added/1,3-cyclohexyl diisocyanate (molar ratio 65/35, Mw=5000, acid value 80 KOH mg/g), solid content 35%}, 35 g of dipentaerythritol hexaacrylate as the multifunctional monomer, 20 g of N-1919 (Adeka Corporation) as the photopolymerization initiator, 5 g of 3-methacryloxypropyltrimethoxysilane as the adhesion promoter, 1 g of F-475 (DIC Corporation) as the leveling agent, 530 g of propyleneglycolmonomethylether acetate as the solvent, and 100 g of 3-methoxybutyl acetate were mixed.

Thereafter, the photoresist resin composition was manufactured by agitating the mixture for 5 hours.

Experimental Example 1

The photoresist resin compositions of Examples 1 to 3 and Comparative Examples 1 to 3 were applied on glass by spin coating, and then subjected to preheating treatment at about 100° C. for 2 mins to form a coat layer having a thickness of about 1.42 μm. Thereafter, after cooling was performed at room temperature, exposure was performed by energy of 100 mJ/cm² under the high pressure mercury lamp by using the photomask. The exposed substrate was developed using the spray manner in the 0.04% KOH aqueous solution at the temperature of 25° C., washed by pure water, dried, and post-baked in the convection oven at 230° C. for 20 mins.

TABLE 1

|  | Example 1 | Example 2 | Example 3 | Comparative Example 1 | Comparative Example 2 | Comparative Example 3 |
|---|---|---|---|---|---|---|
| Thickness of the layer | 1.31 μm | 1.32 μm | 1.30 μm | 1.3 μm | 1.3 μm | 1.3 μm |
| Optical density | 5 | 5 | 5 | — | — | — |
| Taper angle | 40° | 50° | 40° | — | — | 80° |
| Straightness | Favorable | Favorable | Excellent | — | Poor | — |

The films obtained in Examples 1 to 3 were clean coat layers having no surface defects according to each process.

As the film of Example 1, the bezel film having the film thickness of 1.31 μm, the OD of 5.0, the taper angle of 400, and favorable straightness could be ensured.

As the film of Example 2, the bezel film having the film thickness of 1.32 μm, the OD of 5.0, the taper angle of 500, and favorable straightness could be ensured.

As the film of Example 3, the clean coat layer having the film thickness of 1.30 μm and the OD of 5.0 was obtained, and the bezel film having the taper angle of 400 and excellent straightness could be obtained.

The films obtained in Comparative Examples 1 to 3 were clean coat layers having no surface defects according to each process.

However, in Comparative Example 1, since the compound having the long side chain as the monomer for polymerizing the acryl-based binder was not included, the film of Comparative Example 1 had the small developing margin and the inverse taper (T form) causing the short-circuit of the metal wire in the post-process, and thus it was impossible to use the film as the bezel film.

In Comparative Example 2, since the compound having the long side chain as the monomer for polymerizing the acryl-based binder was included in an excessive amount, the pattern straightness became poor, and thus it was impossible to obtain the favorable pattern.

In Comparative Example 3, since the fluorene-based binder as the binder resin was used in an excessive amount, the taper angle was increased to 80° to form the tapered shape causing the short-circuit of the metal wire in the post-process, and thus it was impossible to use the film as the bezel film.

As a result, according to the present specification, the photoresist resin composition for the bezel, which could be directly applied to the cover glass of the touch panel, could ensure the ideal taper angle by optimizing the components and compositional ratios of the used binder resin, and the excellent touch panel could be ensured by applying the photoresist resin composition.

What is claimed is:
1. A photoresist resin composition comprising:
   a binder resin including an acryl-based binder polymerized by a monomer including a compound containing a unsaturated bond, a compound having a long side chain, and a compound including an acid group;
   a polymerizable compound;
   an initiator; and
   a solvent,
   wherein a content of the compound having the long side chain is 1 to 30 mol % based on a total mole number of the monomer;
   wherein the binder resin further includes a fluorene-based binder having a repeating unit represented by the following Chemical Formula 1:

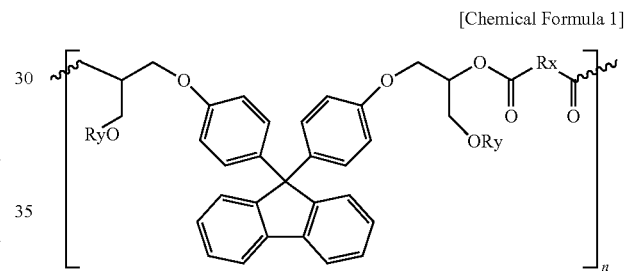

[Chemical Formula 1]

wherein
Rx is a $C_1$ to $C_{10}$ alkylene group; a $C_3$ to $C_{10}$ cycloalkylene group unsubstituted or substituted by a $C_1$ to $C_5$ alkyl group; a $C_6$ to $C_{10}$ arylene group unsubstituted or substituted by a $C_1$ to $C_5$ alkyl group; or —NH—R—NH— unsubstituted or substituted by a $C_1$ to $C_5$ alkyl group,
R is a $C_1$ to $C_{10}$ alkylene group; a $C_3$ to $C_{20}$ cycloalkylene group unsubstituted or substituted by a $C_1$ to $C_5$ alkyl group; or a $C_6$ to $C_{10}$ arylene group unsubstituted or substituted by a $C_1$ to $C_5$ alkyl group,
Ry is hydrogen, acryloyl, or methacryloyl, and
n is an integer of 1 to 5,000.

2. The photoresist resin composition of claim 1, wherein a content of the acryl-based binder is 50 to 90 wt % based on a total weight of the binder resin.

3. The photoresist resin composition of claim 1, wherein the binder resin further includes an additional acryl-based binder polymerized by a compound containing an unsaturated bond and a compound including an acid group.

4. The photoresist resin composition of claim 1, wherein a content of the acryl-based binder is 50 wt % or more and less than 90 wt % and the content of the fluorene-based binder is 10 to 50 wt % based on a total weight of the binder resin.

5. The photoresist resin composition of claim 1, wherein the photoresist resin composition further includes a colorant.

6. The photoresist resin composition of claim 5, wherein a resistance value of the colorant is $10^{12}$ Ω/square or more.

7. The photoresist resin composition of claim 5, wherein the content of the binder resin is 1 to 20 wt %, the content of the polymerizable compound is 1 to 10 wt %, the content of the colorant is 5 to 30 wt %, the content of the initiator is 0.1 to 10 wt %, and the content of the solvent is 60 to 90 wt % based on a total weight of the photoresist resin composition.

8. A touch panel comprising:
  a substrate; and
  a bezel pattern manufactured by using the photoresist resin composition according to claim 1 on the substrate.

9. The touch panel of claim 8, wherein a taper angle of the bezel pattern is more than 0° and 60° or less.

10. The touch panel of claim 8, wherein a thickness of the bezel pattern is 0.3 μm to 5 μm.

11. The touch panel of claim 8, wherein a surface resistance value of the bezel pattern is $10^{12}$ Ω/square or more.

12. The touch panel of claim 8, wherein an optical density per thickness (1 μm) of the bezel pattern is 1 to 5.

13. A display device comprising:
  a substrate; and
  a bezel pattern manufactured by using the photoresist resin composition according to claim 1 on the substrate.

14. The display device of claim 13, wherein a taper angle of the bezel pattern is more than 0° and 60° or less.

15. The display device of claim 13, wherein a thickness of the bezel pattern is 0.3 μm to 5 μm.

16. The display device of claim 13, wherein a surface resistance value of the bezel pattern is $10^{12}$ Ω/square or more.

17. The display device of claim 13, wherein an optical density per thickness (1 μm) of the bezel pattern is 1 to 5.

* * * * *